(12) United States Patent
Takahashi (10) Patent No.: US 8,885,079 B2
(45) Date of Patent: Nov. 11, 2014

(54) BACK-ILLUMINATED SOLID-STATE IMAGE SENSING ELEMENT, METHOD OF MANUFACTURING THE SAME, AND IMAGING DEVICE

(71) Applicant: FUJIFILM Corporation, Tokyo (JP)

(72) Inventor: Shu Takahashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/035,683

(22) Filed: Sep. 24, 2013

(65) Prior Publication Data

US 2014/0098270 A1    Apr. 10, 2014

Related U.S. Application Data

(63) Continuation of application No. PCT/JP2012/055126, filed on Feb. 29, 2012.

(30) Foreign Application Priority Data

Mar. 25, 2011    (JP) .................................. 2011-067891

(51) Int. Cl.
*H04N 5/335*    (2011.01)
*H01L 27/146*    (2006.01)
*H04N 9/04*    (2006.01)
*H04N 5/369*    (2011.01)

(52) U.S. Cl.
CPC .......... *H04N 5/369* (2013.01); *H01L 27/14621* (2013.01); *H01L 27/1464* (2013.01); *H04N 9/045* (2013.01); *H01L 27/14683* (2013.01)
USPC ............................. 348/280; 348/340; 348/308

(58) Field of Classification Search
CPC . H01L 27/1464; H01L 27/146; H01L 31/102; H01L 31/101; H01L 31/0232; H01L 27/14; H04N 3/14; H04N 9/68; H04N 9/083; H04N 1/64; G06K 9/00
USPC ......... 348/272, 273, 275, 276, 277, 280, 281, 348/234, 308, 300, 301, 311, 315; 257/184, 257/292, 440, 444, 187, 432; 382/162, 167; 250/208.1

See application file for complete search history.

(56) References Cited

U.S. PATENT DOCUMENTS

2003/0189656 A1    10/2003    Shinohara
2004/0094783 A1    5/2004    Hong
(Continued)

FOREIGN PATENT DOCUMENTS

CN    101150137 A    3/2008
JP    2002-32023 A    10/2002
(Continued)

OTHER PUBLICATIONS

Japanese Office Action issued in co-pending application No. 2013-507295 mailed May 29, 2013.
(Continued)

*Primary Examiner* — Tuan Ho
(74) *Attorney, Agent, or Firm* — Birch, Stewart, Kolasch & Birch, LLP (57) ABSTRACT

In a back-illuminated solid-state image sensing element, the areas of the front surface sides of individual pixels are the same as one another, regardless of the colors of light components dispersed by filters and entering the individual pixels, and the areas of the rear surface sides of pixels which a dispersed red light component enters are larger than the areas of the rear surface sides of pixels which a green or blue light component enters.

17 Claims, 6 Drawing Sheets

(56) References Cited

U.S. PATENT DOCUMENTS

| | | |
|---|---|---|
| 2006/0043519 A1 | 3/2006 | Ezaki |
| 2006/0197007 A1 | 9/2006 | Iwabuchi et al. |
| 2009/0045415 A1 | 2/2009 | Koshiba |
| 2009/0057539 A1 | 3/2009 | Iwabuchi et al. |
| 2009/0189234 A1* | 7/2009 | Mabuchi .................. 257/432 |
| 2010/0140453 A1 | 6/2010 | Kikuchi |
| 2010/0140731 A1 | 6/2010 | Lee |
| 2010/0207231 A1 | 8/2010 | Iwamoto et al. |
| 2010/0214454 A1* | 8/2010 | Kikuchi .................. 348/272 |
| 2010/0237451 A1 | 9/2010 | Murakoshi |
| 2010/0291730 A1 | 11/2010 | Uya et al. |
| 2010/0327388 A1 | 12/2010 | McCarten et al. |
| 2011/0141333 A1 | 6/2011 | Naruse et al. |

FOREIGN PATENT DOCUMENTS

| | | |
|---|---|---|
| JP | 2003-020303 A | 1/2003 |
| JP | 2003-298038 A | 10/2003 |
| JP | 2004-165589 A | 6/2004 |
| JP | 2005-353994 A | 12/2005 |
| JP | 2006-073682 A | 3/2006 |
| JP | 2006-245499 A | 9/2006 |
| JP | 2009-004615 A | 1/2009 |
| JP | 2010-129548 A | 6/2010 |
| JP | 2010-192483 A | 9/2010 |
| JP | 2010-225818 A | 10/2010 |
| JP | 2010-245100 A | 10/2010 |
| JP | 2011-129638 A | 6/2011 |
| WO | WO 2008/016035 A1 | 2/2008 |

OTHER PUBLICATIONS

PCT/ISA/210—International Search Report mailed on Apr. 10, 2012, issued in PCT/JP2012/055126.

PCT/ISA/237—mailed on Apr. 10, 2012, issued in PCT/JP2012/055126.

CN Office Action, dated Apr. 24, 2014, in related application No. CN 201280015149.6.

* cited by examiner

BACK-ILLUMINATED SOLID-STATE IMAGE SENSING ELEMENT, METHOD OF MANUFACTURING THE SAME, AND IMAGING DEVICE

CROSS-REFERENCE TO RELATED APPLICATIONS

This is a continuation of International Application No. PCT/JP2012/055126 filed on Feb. 29, 2012, and claims priority from Japanese Patent Application No.: 2011-067891 filed on Mar. 25, 2011, the entire disclosures of which are incorporated herein by reference.

TECHNICAL FIELD

The present invention relates to a back-illuminated solid-state image sensing element, a method of manufacturing the back-illuminated solid-state image sensing element, and an imaging device.

BACKGROUND ART

For example, in a solid-state imaging device which has color filters of primary colors R (red), G (green), and B (blue) and acquires color images, pixels (photodiodes which are photoelectric conversion elements) for red detection, pixels for green detection, and pixels for blue detection are provided on a semiconductor substrate. On the individual pixels, micro lenses (top lens) are stacked, and incident light condensed by the individual micro lenses enters pixels corresponding to the micro lenses, through corresponding color filters.

Recently, with an increase in the number of pixels, solid-state image sensing elements having 10 million pixels or more have become normal. For this reason, each pixel has been miniaturized, and the size of each pixel also has approximated the order of the wavelength of incident light. However, on the optical principles, it is impossible to make the focal point of a lens within a distance equal to or less than the wavelength of incident light. For this reason, it is impossible to condense red light having the longest wavelength among the red light, green light, and blue light within a distance equal to or less than a wavelength of about 700 nm. Therefore, there is a high probability that red light will leak into neighboring pixels, resulting in color mixture or crosstalk.

For this reason, in the related art, as described in Patent Document 1, the light receiving areas of pixels are set to decrease in the order of R pixels, G pixels, and B pixels, such that the areas of the red (R) pixels for receiving light having a long wavelength are large, whereby color mixture or crosstalk is reduced.

Patent Document 1: Japanese Patent Application Publication No. 2010-129548

Like the related technology disclosed in Patent Document 1, if the sizes (light receiving areas) of pixels are set differently according to the wavelengths of incident light components, it is possible to reduce color mixture and crosstalk. However, if the sizes of pixels depend on the colors of incident light components, differences in characteristics such as a characteristic of reading acquired image signals from pixels (photodiodes) (a read voltage), and the saturation characteristic of each pixel arise between the individual colors, and this is a problem.

An object of the present invention relates to a back-illuminated solid-state image sensing element, a method of manufacturing the back-illuminated solid-state image sensing element, and an imaging device capable of reducing crosstalk of pixels receiving long-wavelength light with neighboring pixels, without changing the characteristics of each pixel such as a read characteristic and a saturation characteristic.

SUMMARY

A back-illuminated solid-state image sensing element and a method of manufacturing the same according to the present invention is characterized by including: a semiconductor substrate in which a plurality of photodiodes are arranged in a two-dimensional array and each of the plurality of photodiodes is formed from a rear surface side into which light enters, to a front surface side; a color filter stacked on the rear surface side of the semiconductor substrate to disperse light; micro lenses stacked on a rear surface side of the color filter for the individual photodiodes to condense incident light such that the incident light enters rear surface sides of the corresponding photodiodes; and a signal reading unit formed on the front surface side of the semiconductor substrate to read acquired image signals detected by the photodiodes according to the amounts of received light components, wherein the areas of front surface sides of the individual photodiodes are formed to be the same as one another, regardless of colors of light components dispersed by the color filter and entering into the photodiodes, and the areas of rear surface sides of the photodiodes into which a dispersed red light component enters are formed larger than the areas of rear surface sides of the photodiodes into which a green or blue light component enters.

An imaging device according to the present invention is characterized by including the above-mentioned back-illuminated solid-state image sensing element.

According to the present invention, it becomes possible to reduce crosstalk of pixels receiving long-wavelength light with neighboring pixels, without changing the characteristics of each pixel (photodiode) such as a read characteristic and a saturation characteristic.

DETAILED DESCRIPTION

Hereinafter, embodiments of the present invention will be described with reference to the accompanying drawings.

Figure 1:
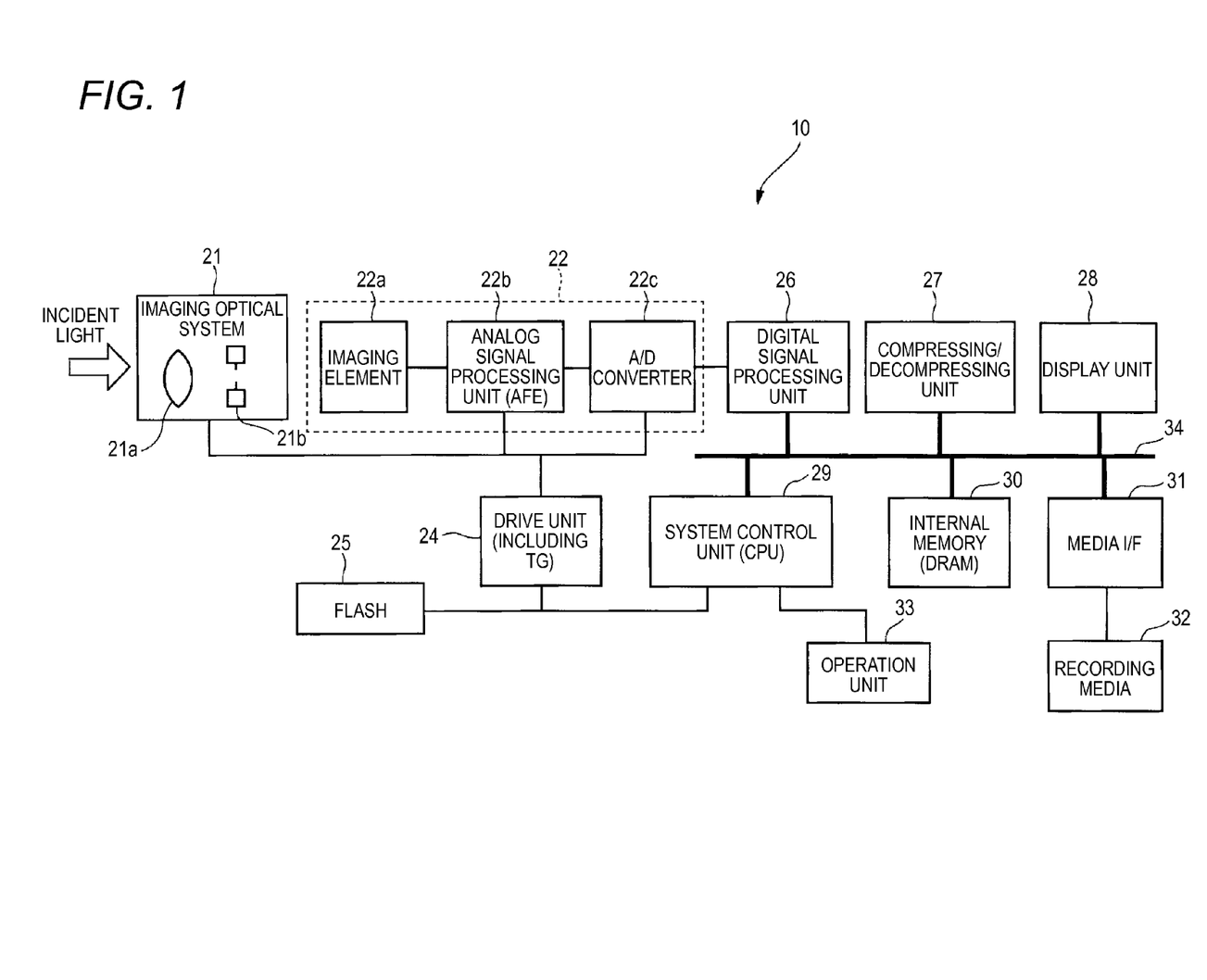
FIG. 1 is a functional block diagram of an imaging device according to an embodiment of the present invention.

FIG. 1 is a functional block configuration diagram of a digital camera (an imaging device) having a solid-state image sensing element according to an embodiment of the present invention. This digital camera 10 includes an imaging optical system 21, and an imaging element chip 22 disposed at the next stage of the imaging optical system 21. The imaging optical system 21 includes an imaging lens 21a, a diaphragm 21b, a mechanical shutter (not shown), and so on. There are also models having no mechanical shutter.

The imaging element chip 22 includes a signal reading unit, which includes a back-illuminated solid-state image sensing element 22a that is for acquiring color images and is of a CCD type, a CMOS type, or the like, an analog signal processing unit (AFE) 22b that performs analog processing such as automatic gain control (AGC) or correlation double sampling on analog image data output from the back-illuminated solid-state image sensing element 22a, and an analog-to-digital converter (A/D) 22c for converting analog image data output from the analog signal processing unit 22b into digital image data.

The digital camera 10 further includes a drive unit (including a timing generator TG) 23 for performing drive control on the solid-state image sensing element 22a, the analog signal processing unit 22b, and the A/D 22c according to instructions from a system control unit (CPU) 29 to be described below, and a flash 25 for emitting light according to instructions from the CPU 29. The drive unit 23 may be integrally installed in the imaging element chip 22.

The digital camera 10 of the present embodiment further includes a digital signal processing unit 26 for receiving digital image data output from the A/D 22c and performing known image processing such as interpolation, white balance correction, or RGB-to-YC conversion, a compressing/decompressing unit 27 for compressing image data into image data of a JPEG format or the like, or decompressing image data of a JPEG format or the like, a display unit 28 for displaying menus or displaying through-the-lens images or acquired images, the system control unit (CPU) 29 for generally controlling the entire digital camera, an internal memory 30 such as a frame memory, a media interface (I/F) unit 31 for performing an interface process with respect to recording media 32 for storing JPEG image data and the like, and a bus 34 for connecting them to one another. Also, the system control unit 29 is connected to an operation unit 33 for allowing a user to input instructions.

Figure 2:
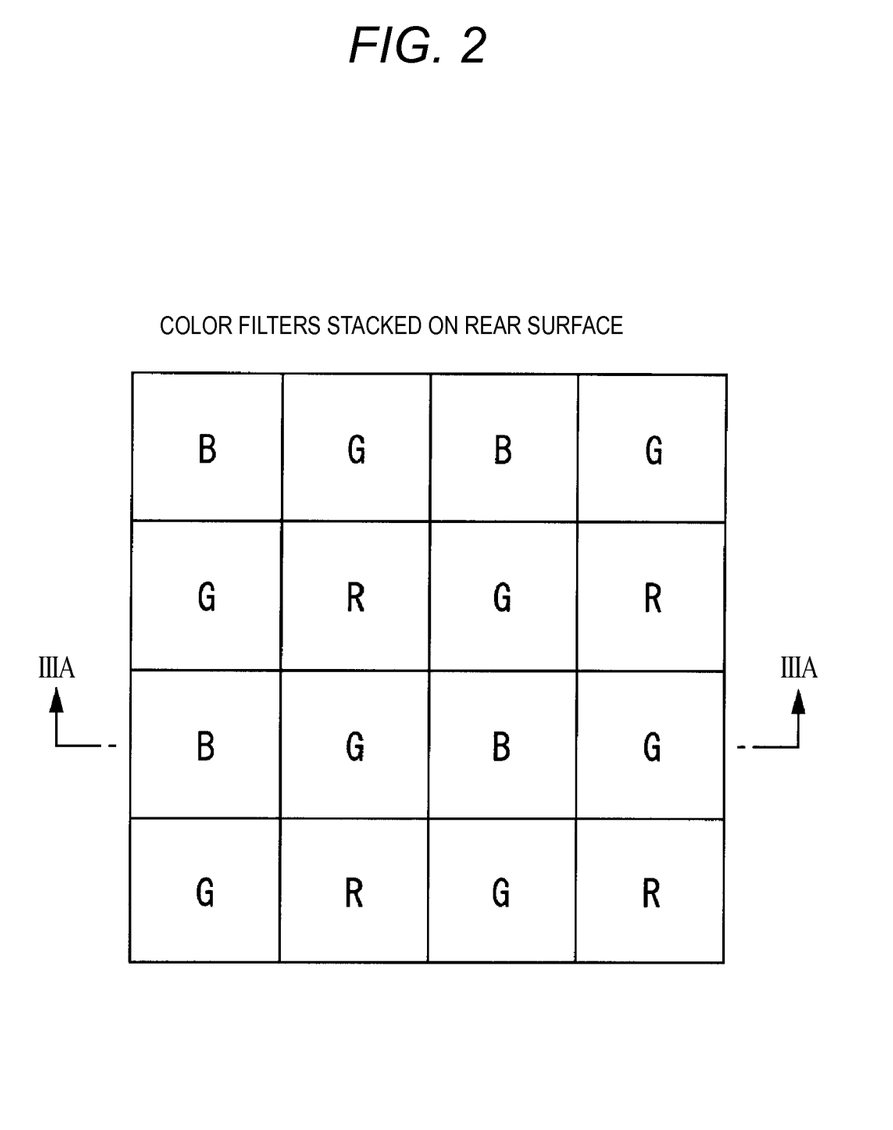
FIG. 2 is a view illustrating examples of color filters provided on the rear surface side of a back-illuminated solid-state image sensing element shown in FIG. 1.

FIG. 2 is a view illustrating a color filter array of a portion of the rear-surface-side light receiving surface of the back-illuminated solid-state image sensing element 22a shown in FIG. 1. In the back-illuminated solid-state image sensing element 22a of the present embodiment, color filters R, G, and B of three primary colors are arranged in a Bayer array.

Figure 3A:
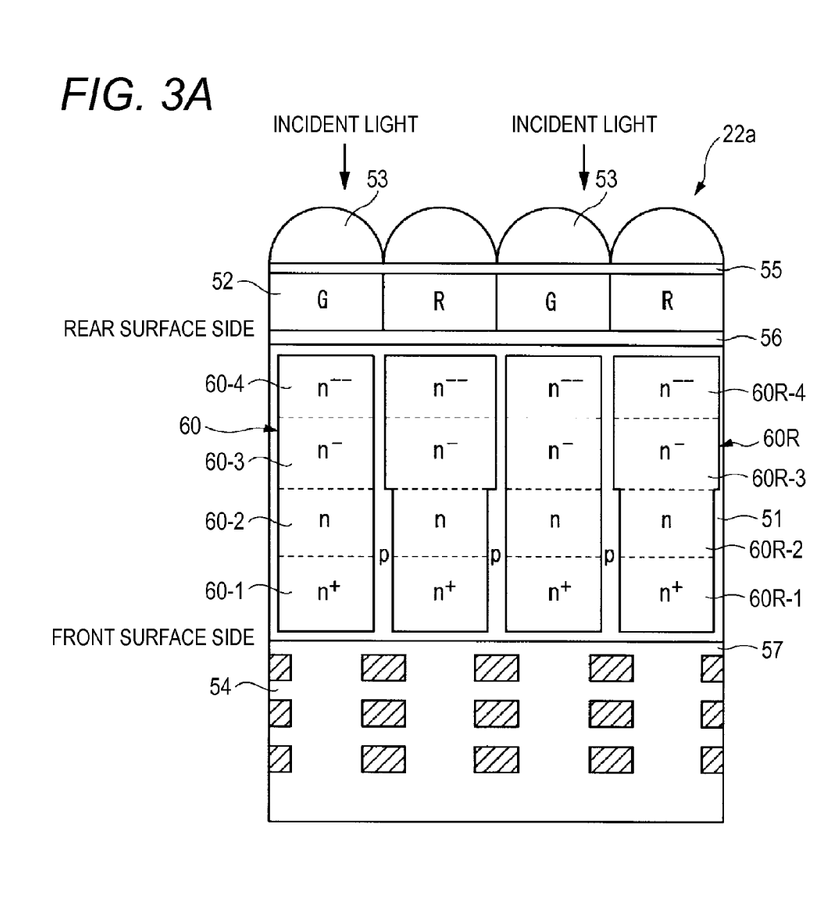
FIGS. 3A and 3B show a schematic cross-sectional view (FIG. 3A) taken along a line IIIA-IIIA of FIG. 2, and a comparative view (FIG. 3B).

FIG. 3A is a schematic cross-sectional view taken along a line IIIA-IIIA of FIG. 2. In the back-illuminated solid-state image sensing element 22a of the present embodiment, on the rear surface side (the light incidence side is referred to as the rear surface side) of a p-type semiconductor substrate 51, the color filters (R, G, and B) 52 corresponding to the individual pixels are stacked, and on the color filters 52, micro lenses 53 corresponding to the individual pixels are stacked. The micro lenses 53 corresponding to the individual pixels are formed in the same shape and size by the same manufacturing process. In the present embodiment, for example, the p-type semiconductor substrate 51 having a thickness of, for example, 3 μm to 4 μm is used. However, it is possible to use a substrate having a different thickness.

On the front surface side of the p-type semiconductor substrate 51, a signal reading unit 54 (a signal reading circuit) for reading an acquired image signal from each pixel is formed. Since the back-illuminated solid-state image sensing element 22a of the example shown in FIG. 3A is of a CMOS type, in FIG. 3A, three wiring layers of the signal reading unit 54 composed of CMOS type transistors are shown.

Between the color filters 52 and the micro lenses 53, a transparent flat film 55 is stacked, and even between the p-type semiconductor substrate 51 and the color filters 52, a transparent flat film, an oxide film 56, or the like is provided. Even on the front surface side of the p-type semiconductor substrate 51, an insulating layer 57 or the like is provided, and a front-surface high-concentration p-type layer (not shown) for preventing white defects attributable to dark current, or the like is provided.

From right below the color filters R, G, and B corresponding to the individual pixels of the p-type semiconductor substrate 51 (right below the rear surface side of the semiconductor substrate 51) to the front surface side of the p-type semiconductor substrate 51 where the signal reading unit 54 is provided, an n-type region 60 is provided for each pixel.

This n-type region 60 is composed of n-type regions 60-1, 60-2, 60-3, and 60-4 which form a four-layered structure and have impurity concentrations sequentially decreasing from the front surface side to rear surface side of the semiconductor substrate 51. Preferably, an n-type impurity ion implantation concentration per unit area of the n-type region 60-1 of the first layer may be set to $1e12/cm^2$ or more, and the ion implantation concentrations of the n-type regions of the second to fourth layers may be set to less than $1e12/cm^2$.

In the individual pixels having the R, G, and B color filters stacked thereon, the n-type regions 60 are provided. In the present embodiment, only the structures of the n-type regions (denoted by a reference symbol "60R") of pixels having the R filters stacked thereon are different from the structures of the other n-type regions 60 of the pixels having the B filters and the G filters.

The n-type regions 60B of the pixels having the R filters stacked thereon have a structure composed of four layers 60R-1, 60R-2, 60R-3, and 60R-4 having n-type impurity concentrations decreasing sequentially from the front surface side to rear surface side of the semiconductor substrate 51, like the other n-type regions 60. In the example shown in FIG. 3A, the thicknesses of the individual n-type region layers 60-i (i=1, 2, 3, or 4) are the same. However, the present invention is not limited thereto.

The areas of the layers 60R-1 which are the first layers of the n-type regions 60R from the front surface side and have the highest n-type impurity concentration, that is, the n-type regions 60R-1 for reading acquired image signals (the areas seen from the front surface side or rear surface side of the semiconductor substrate) are the same as the areas of the first layers 60-1 of the other color n-type regions 60 from the front surface side. In the present embodiment, the areas of the second layers 60R-2 and 60-2 from the front surface side are also the same as the areas of the first layers 60R-1 and 60-1.

Figure 3B:
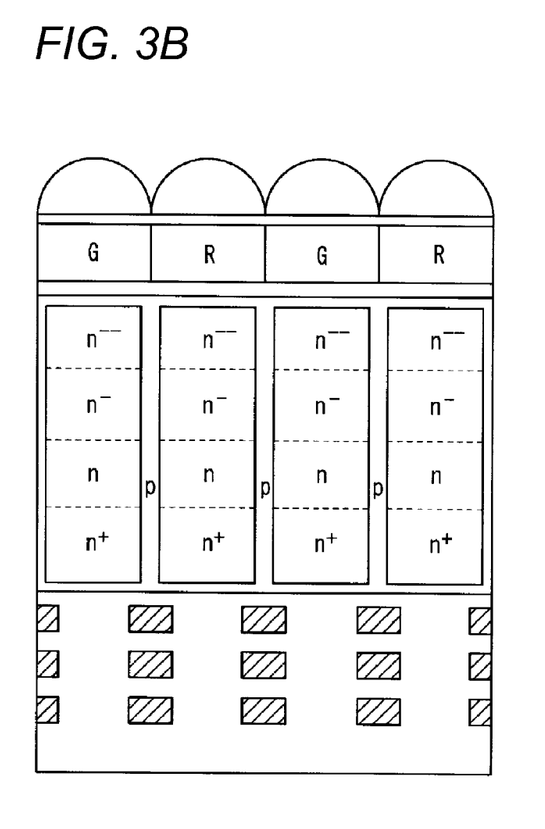

However, in the present embodiment, the areas of the layers 60R-3 and 60R-4 which are the third and fourth layers of the n-type regions 60R from the front surface side and have low impurity concentrations are wider than those of the layers 60-3 and 60-4 which are the third and fourth layers of the n-type regions 60 of the other colors from the front surface side. FIG. 3B is a view for comparison with FIG. 3A, and in FIG. 3B, all of n-type regions of pixels having R filters stacked thereon have the same area, and also have the same area as those of the other color pixels.

Since the focal point of each micro lens 53 is made to fall within a range between the rear surface of the semiconductor substrate 51 and a depth corresponding to about the rear surface side half of the fourth layer 60-4 or 60R-4 of an n-type region 60 or 60R, if the area of the fourth layer 60R-4 is set to be wider than those of the neighboring pixels, it is possible to reduce crosstalk in which R light leaks into the neighboring pixels of the n-type region layers 60-4 when the R light is condensed into the n-type region layers.

Signal charge (electrons) obtained by photoelectric conversion in the fourth and third layers 60R-4 and 60R-3 having the low impurity concentrations moves to the layers 60R-2 and 60R-1 having high impurity concentrations, and is accumulated in the first layers 60R-4.

If the first layers 60R-1 are made to have the same wide area as those of the fourth layers 60R-4, the areas of the first layers 60R-1 are different from those of the first layers 60-1 of the other n-type regions 60. As a result, in a case of reading acquired image signals from the first layers, a problem in which characteristics such as read characteristics and saturation characteristics become different between the pixels having the R filters stacked thereon and the other pixels having the other color (G and B) filters occurs.

However, in the present embodiment, since the areas of the fourth layers 60R-4 and the third layers 60R-3 for receiving incident light are set to be wider than those of the blue detection pixels and the green detection pixels, and the areas of the first layers 60R-1 of the red detection pixels for reading acquired image signals are set to be the same as those of the first layers 60-1 of the other colors, the read characteristics, the saturation characteristics, and the like become the same. Also, as described above, since the impurity concentrations of the layers 60R-4 and 60R-3 which are far from the first layers 60R-1 for reading signals and have wide areas are set to be low, the influence of the read characteristics, the saturation characteristics, and the like on the first layers is reduced.

Further, if the thicknesses of the first layers 60-1 and 60R-1 are set to be at least about 1 μm or less, the influence of the fourth layers 60R-4 with large areas on the first layers 60R-1 is eliminated, such that the first layers 60R-1 have the same read characteristic, saturation characteristic, and the like as those of the first layers 60-1 of the other colors.

FIG. 4 is a view illustrating masks for forming the n-type regions 60-i and 60R-i (i is an integer between 1 and 4) of the four layers with different concentrations by implementing ions in the p-type semiconductor substrate 51 of the solid-state image sensing element 22a shown in FIG. 3A. In FIG. 4, white rectangular portions are through-holes, and through these holes, n-type impurities are implemented from the front surface side. R, G, and B written in the rectangular portions represent corresponding color filters R, G, and B.

Figure 4A:
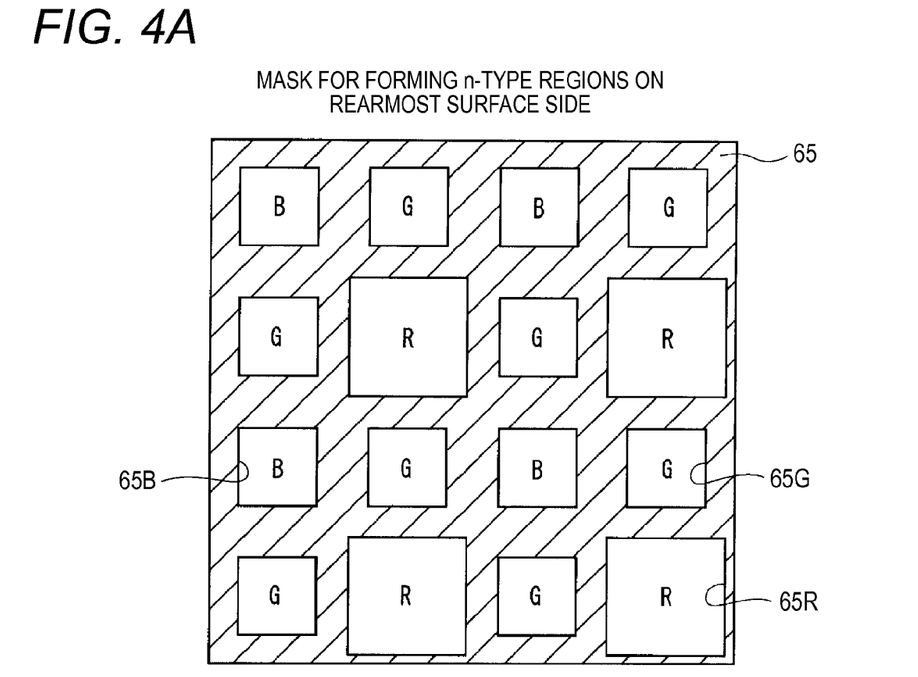
FIGS. 4A and 4B are views illustrating masks for forming n-type regions with different impurity concentrations shown in FIG. 3A.
Figure 4B:
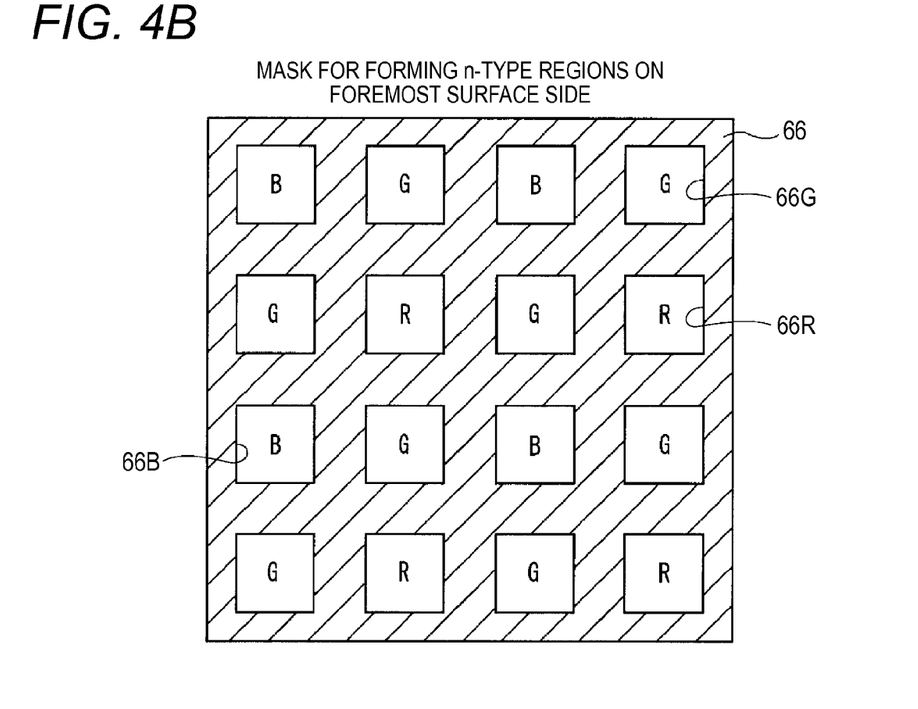

FIG. 4A shows a mask 65 for forming the layers 60-4, 60-3, 60R-4, and 60R-3 shallow from the rear surface side of the semiconductor substrate 51, and FIG. 4B shows a mask 66 for forming the layers 60-1, 60-2, 60R-1, and 60R-2 deep from the rear surface side of the semiconductor substrate 51. In a case of performing ion implantation from the front surface side of the semiconductor substrate 51, in order to form the layers 60-1 and 60R-1 closest to the front surface side, impurities are implemented at high concentration with low energy, and to form the layers 60-4 and 60R-4 deepest from the front surface, impurities are implemented at low concentration with high energy.

In the mask 66, the opening areas of the individual holes 66R, 66G, and 66B of R, G, and B are the same; whereas in the mask 65, the opening areas of the holes 65R for R are wider than those of the individual holes 65G and 65B for G and B. Therefore, it becomes possible to make the areas of the third and fourth layers of the n-type regions 60R of the red detection pixels wider than the areas of the first and second layers.

Figure 5:
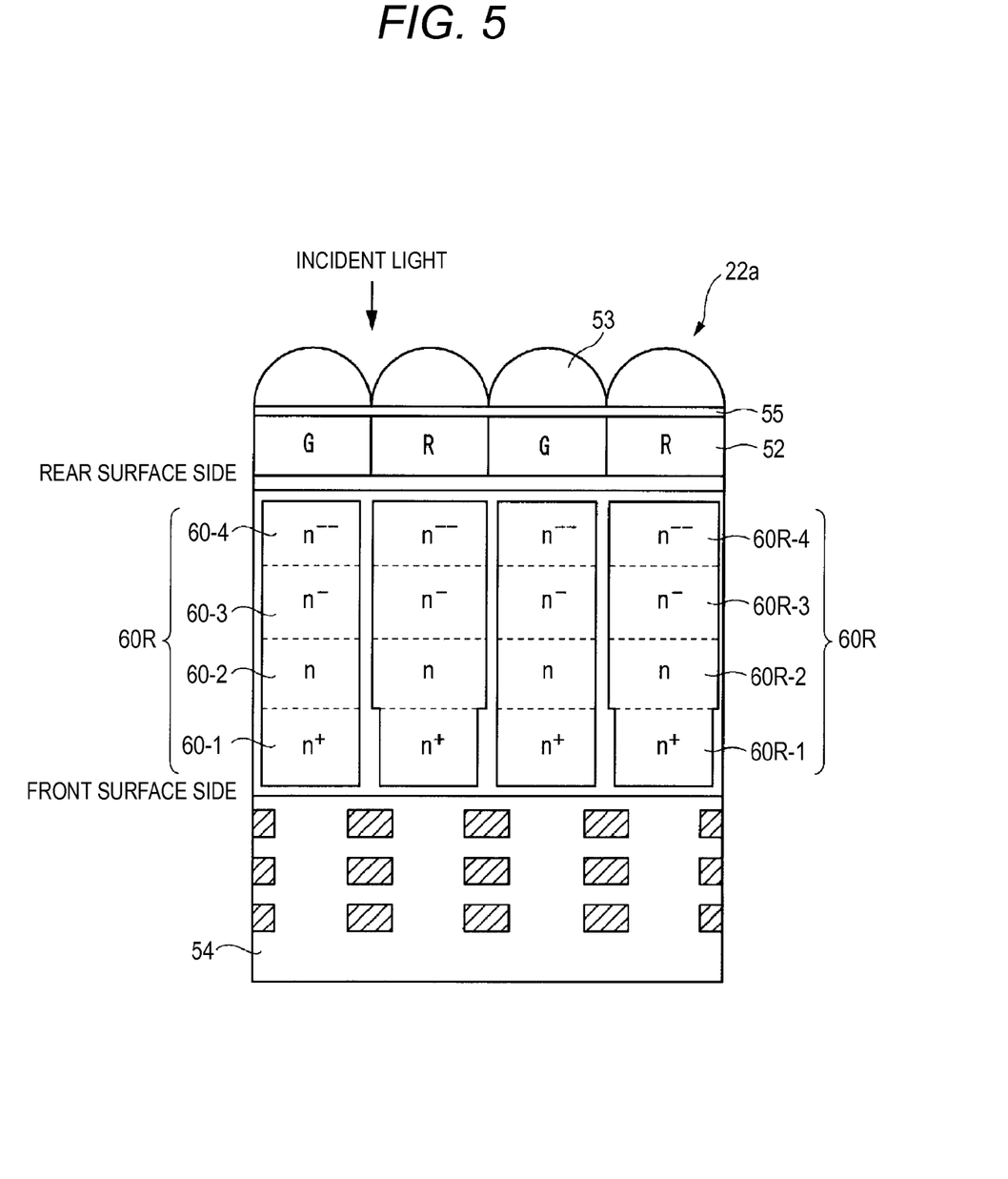
FIG. 5 is a schematic cross-sectional view of another embodiment which takes place of the embodiment of FIG. 3A.

FIG. 5 is a schematic cross-sectional view of a back-illuminated solid-state image sensing element according to another embodiment of the present invention which takes place of the embodiment of FIG. 3A. A difference from the embodiment of FIG. 3A is that the areas of the second layers 60R-2 of the n-type regions 60R also are set to be wide, and only the first layers 60R-1 have the same areas as the areas of the other n-type regions 60.

Even in this embodiment, it is possible to prevent crosstalk of red light, and so on. In the back-illuminated solid-state image sensing element, the proportion of photoelectric conversion elements in the light receiving surface is higher such that light sensitivity is higher, and the semiconductor substrate is thicker, as compared to a front-illuminated solid-state image sensing element having a signal reading unit provided integrally on the light receiving surface side of photodiodes (pixels). Since the penetration distance of incident light into the semiconductor substrate increases with an increase in the wavelength, as compared to the front-illuminated type, in the back-illuminated type, particularly crosstalk of red light becomes a problem.

However, like the embodiments of FIG. 3A and FIG. 5, if the areas of the n-type regions 60R are set to be wide up to a position deep from the front-surface-side light incidence surface of the semiconductor substrate, even if red light unlikely to be absorbed in the semiconductor substrate spreads in the semiconductor substrate beyond the focal points, it is possible to absorb the red light in the n-type regions 60R and perform photoelectric conversion on the red light. Therefore, it is possible to reduce crosstalk and color mixture.

Figure 6:
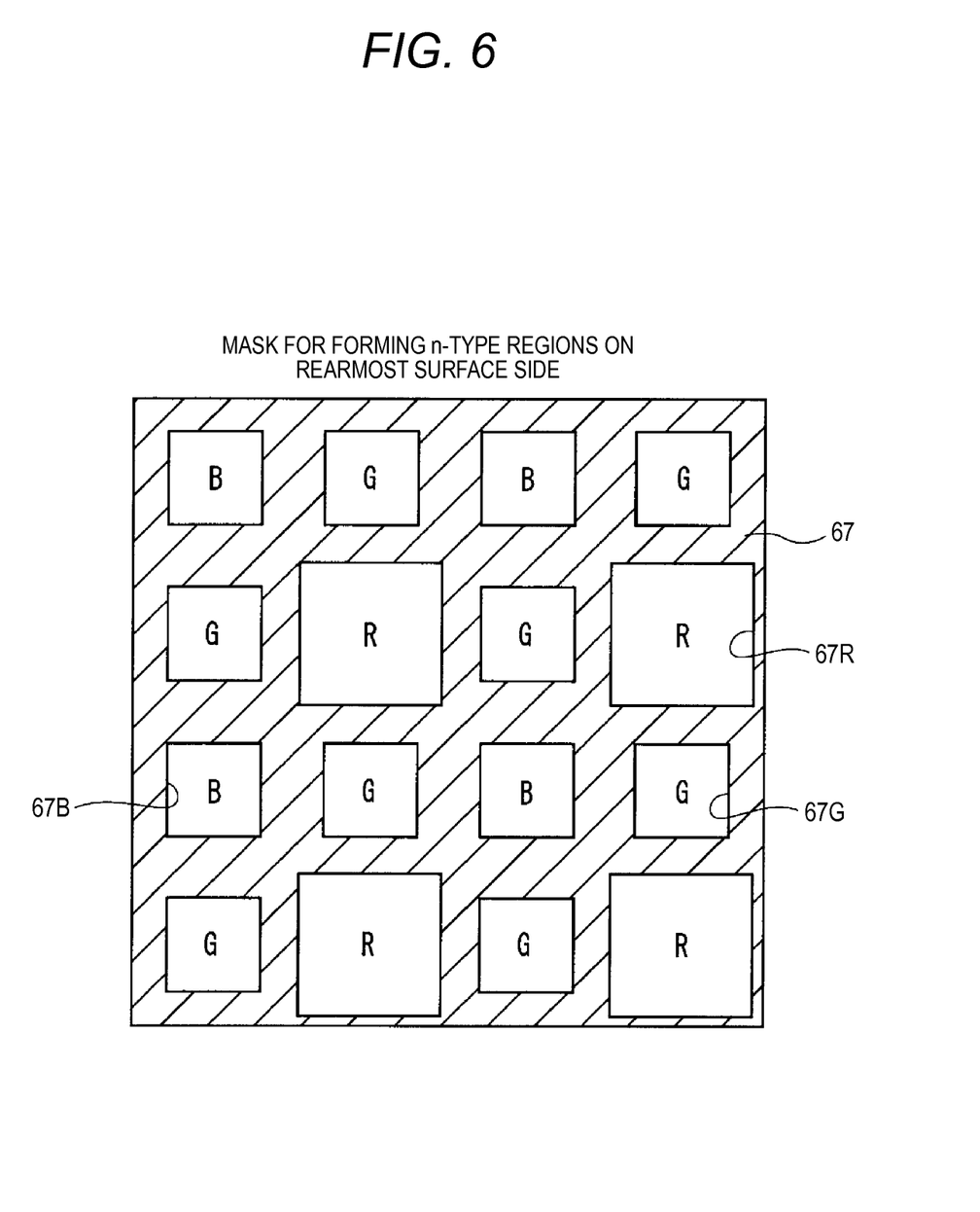
FIG. 6 is a view illustrating a mask of another embodiment which takes place of FIG. 4A.

FIG. 6 is a view illustrating a mask according to another embodiment of the present invention which takes place of the embodiment of FIG. 4A. While a mask for forming the n-type regions 60-1 and 60R-1 on the signal reading circuit side is the same as that of FIG. 4A, as a mask for forming layers of regions deep from the front surface (that is, regions shallow from the rear surface) by ion implantation, the mask shown in FIG. 6 is used.

In the mask 65 of FIG. 4A, the areas of the individual holes (or the lengths of the sides of the rectangles) are set such that the areas of the holes 65R are larger than the areas of the holes 65G which are the same as the areas of the holes 65B. However, in a mask 67 of the present embodiment, the areas of individual holes are set in the order of the wavelengths of incident light components such that the areas of holes 67R are larger than the areas of holes 67G which are larger than the areas of holes 67B. Like this, it is preferable that the areas of the holes have a magnitude relation according to the wavelength ratio of the center wavelengths of incident light components passing through the filters of the individual colors. Therefore, it is possible to reduce crosstalk of not only red light but also green light.

As described above, since the light receiving areas of the photodiodes for receiving red light of incident light are set to be wider than the light receiving areas of the photodiodes for receiving light of the other colors, and the areas of the photodiodes of a portion for reading acquired image signals are set to be constant for each color, it becomes possible to reduce crosstalk of red light, without changing the read characteristic, the saturation characteristic, or the like for each color.

Also, in the above-mentioned embodiments, the back-illuminated solid-state image sensing element including the pixels (photodiodes) arranged in a square grid array (an example of a two-dimensional array) and the color filters arranged in a Bayer array on the semiconductor substrate has been described. However, the present invention is not limited thereto. The present invention can be applied even to a so-called honeycomb pixel array in which odd-numbered pixel rows are deviated from even-numbered pixel rows by ½ of a pixel pitch, and can also be applied to elements in which a color filter array is, for example, a longitudinal stripe array or a lateral stripe array.

Also, in the embodiment of FIG. 3A, the areas of the third layers 60R-3 and the fourth layers 60R-4 are set to be wide. However, even if the areas of only the fourth layers 60R-4 are set to be wide, it is possible to obtain the effects of the present invention.

Further, in the embodiments of FIG. 3 and FIG. 5, the n-type regions 60 and 60R have the four-layer structure. However, the n-type regions may have a two-layer structure, a three-layer structure, or any other structure, and if the areas of light-incidence-surface-side layers of the photodiodes for receiving red light are set to be wider than those for the other colors, it is possible to obtain the same effects as those of the above-mentioned embodiments.

As explained above, according to the embodiments, a back-illuminated solid-state image sensing element and a method of manufacturing the same are characterized by including: a semiconductor substrate in which a plurality of photodiodes are arranged in a two-dimensional array and each of the plurality of photodiodes is formed from a rear surface side into which light enters, to a front surface side; a color filter stacked on the rear surface side of the semiconductor substrate to disperse light; micro lenses stacked on a rear surface side of the color filter for the individual photodiodes to condense incident light such that the incident light enters rear surface sides of the corresponding photodiodes; and a signal reading unit formed on the front surface side of the semiconductor substrate to read acquired image signals detected by the photodiodes according to the amounts of received light components, wherein the areas of front surface sides of the individual photodiodes are formed to be the same as one another, regardless of colors of light components dispersed by the color filter and entering into the photodiodes, and the areas of rear surface sides of the photodiodes into which a dispersed red light component enters are formed larger than the areas of rear surface sides of the photodiodes into which a green or blue light component enters.

According to the embodiments, the back-illuminated solid-state image sensing element and the method of manufacturing the same are characterized in that, the areas of the rear surface sides of the photodiodes into which the green light component enters are formed larger than the areas of the rear surface sides of the photodiodes into which the blue light component enters.

According to the embodiments, the back-illuminated solid-state image sensing element and the method of manufacturing the same are characterized in that, each of the photodiodes is formed such that an impurity concentration on the rear surface side is lower than an impurity concentration on the front surface side.

According to the embodiments, the back-illuminated solid-state image sensing element and the method of manufacturing the same are characterized in that, each of the photodiodes are formed with a plurality of layers with impurity concentrations sequentially increasing from the rear surface side to the front surface side.

According to the embodiments, the back-illuminated solid-state image sensing element and the method of manufacturing the same are characterized in that, the plurality of layers is composed of at least three layers, and a layer having the larger area is only a layer closest to the rear surface side.

According to the embodiments, the back-illuminated solid-state image sensing element and the method of manufacturing the same are characterized in that, the plurality of layers is composed of at least three layers, and layers having the larger areas are layers other than a layer closest to the front surface side.

According to the embodiments, the back-illuminated solid-state image sensing element and the method of manufacturing the same are characterized in that, the thickness of a layer closest to the front surface side among the plurality of layers is formed to be at least 1 μm or more.

According to the embodiments, the back-illuminated solid-state image sensing element and the method of manufacturing the same are characterized in that, in the photodiodes, a layer closest to the front surface side is formed at an ion implantation concentration of $1e12/cm^2$ or more per unit area.

According to the embodiments, the back-illuminated solid-state image sensing element and the method of manufacturing the same are characterized in that, in the photodiodes, layers other than a layer closest to the front surface side are formed at ion implantation concentrations less than $1e12/cm^2$ per unit area.

According to the embodiments, an imaging device is characterized by including the back-illuminated solid-state image sensing element as set forth in any one of the above configurations.

According to the above-mentioned embodiments, it becomes possible to reduce crosstalk of pixels for receiving long-wavelength light with neighboring pixels, without changing the characteristics of each pixel (photodiode) such as a read characteristic and a saturation characteristic.

Since it is possible to reduce particularly crosstalk of red light, the back-illuminated solid-state image sensing element according to the present invention is useful for apparatuses for acquiring high-quality subject images such as digital cameras, camera-equipped portable phones, camera-equipped electronic apparatuses, and imaging devices for endoscopes.

What is claimed is:

1. A back-illuminated solid-state image sensing element comprising:
a semiconductor substrate in which a plurality of photodiodes are arranged in a two-dimensional array and each of the plurality of photodiodes is formed from a rear surface side into which light enters, to a front surface side;
a color filter stacked on the rear surface side of the semiconductor substrate to disperse light;
micro lenses stacked on a rear surface side of the color filter for the individual photodiodes to condense incident light such that the incident light enters rear surface sides of the corresponding photodiodes; and
a signal reading unit formed on the front surface side of the semiconductor substrate to read acquired image signals detected by the photodiodes according to the amounts of received light components,
wherein the areas of front surface sides of the individual photodiodes are formed to be the same as one another, regardless of colors of light components dispersed by the color filter and entering into the photodiodes, and the areas of rear surface sides of the photodiodes into which a dispersed red light component enters are formed larger than the areas of rear surface sides of the photodiodes into which a green or blue light component enters, wherein the areas of the rear surface sides of the photodiodes into which the green light component enters are formed larger than the areas of the rear surface sides of the photodiodes into which the blue light component enters.

2. A back-illuminated solid-state image sensing element comprising:
- a semiconductor substrate in which a plurality of photodiodes are arranged in a two-dimensional array and each of the plurality of photodiodes is formed from a rear surface side into which light enters, to a front surface side;
- a color filter stacked on the rear surface side of the semiconductor substrate to disperse light;
- micro lenses stacked on a rear surface side of the color filter for the individual photodiodes to condense incident light such that the incident light enters rear surface sides of the corresponding photodiodes; and
- a signal reading unit formed on the front surface side of the semiconductor substrate to read acquired image signals detected by the photodiodes according to the amounts of received light components,
- wherein the areas of front surface sides of the individual photodiodes are formed to be the same as one another, regardless of colors of light components dispersed by the color filter and entering into the photodiodes, and the areas of rear surface sides of the photodiodes into which a dispersed red light component enters are formed larger than the areas of rear surface sides of the photodiodes into which a green or blue light component enters,
- wherein each of the photodiodes is formed such that an impurity concentration on the rear surface side is lower than an impurity concentration on the front surface side.

3. The back-illuminated solid-state image sensing element according to claim 2, wherein each of the photodiodes are formed with a plurality of layers with impurity concentrations sequentially increasing from the rear surface side to the front surface side.

4. The back-illuminated solid-state image sensing element according to claim 3, wherein the plurality of layers is composed of at least three layers, and a layer having the larger area is only a layer closest to the rear surface side.

5. The back-illuminated solid-state image sensing element according to claim 3, wherein the plurality of layers is composed of at least three layers, and layers having the larger areas are layers other than a layer closest to the front surface side.

6. The back-illuminated solid-state image sensing element according to any one of claims 3 to 5, wherein the thickness of a layer closest to the front surface side among the plurality of layers is formed to be at least 1 µm or more.

7. The back-illuminated solid-state image sensing element according to any one of claims 3 to 5, wherein in the photodiodes, a layer closest to the front surface side is formed at an ion implantation concentration of $1e12/cm^2$ or more per unit area.

8. The back-illuminated solid-state image sensing element according to any one of claims 3 to 5, wherein in the photodiodes, layers other than a layer closest to the front surface side are formed at ion implantation concentrations less than $1e12/cm^2$ per unit area.

9. An imaging device comprising the back-illuminated solid-state image sensing element according to any one of claims 1 to 5.

10. A method of manufacturing a back-illuminated solid-state image sensing element which includes a semiconductor substrate in which a plurality of photodiodes are arranged in a two-dimensional array and each of the plurality of photodiodes is formed from a rear surface side into which light enters, to a front surface side, a color filter stacked on the rear surface side of the semiconductor substrate to disperse light, micro lenses stacked on a rear surface side of the color filter for the individual photodiodes to condense incident light such that the incident light enters rear surface sides of the corresponding photodiodes, and a signal reading unit formed on the front surface side of the semiconductor substrate to read acquired image signals detected by the photodiodes according to the amounts of received light components, the method comprising:
- forming the areas of front surface sides of the individual photodiodes to be the same as one another, regardless of colors of light components dispersed by the color filter and entering into the photodiodes, and forming the areas of rear surface sides of the photodiodes into which a dispersed red light component enters larger than the areas of rear surface sides of the photodiodes into which a green or blue light component enters, wherein the areas of the rear surface sides of the photodiodes into which the green light component enters are formed larger than the areas of the rear surface sides of the photodiodes which the blue light component enters.

11. A method of manufacturing a back-illuminated solid-state image sensing element which includes a semiconductor substrate in which a plurality of photodiodes are arranged in a two-dimensional array and each of the plurality of photodiodes is formed from a rear surface side into which light enters, to a front surface side, a color filter stacked on the rear surface side of the semiconductor substrate to disperse light, micro lenses stacked on a rear surface side of the color filter for the individual photodiodes to condense incident light such that the incident light enters rear surface sides of the corresponding photodiodes, and a signal reading unit formed on the front surface side of the semiconductor substrate to read acquired image signals detected by the photodiodes according to the amounts of received light components, the method comprising:
- forming the areas of front surface sides of the individual photodiodes to be the same as one another, regardless of colors of light components dispersed by the color filter and entering into the photodiodes, and forming the areas of rear surface sides of the photodiodes into which a dispersed red light component enters larger than the areas of rear surface sides of the photodiodes into which a green or blue light component enters, wherein the areas of the rear surface sides of the photodiodes into which the green light component enters are formed larger than the areas of the rear surface sides of the photodiodes which the blue light component enters, wherein each of the photodiodes is formed such that an impurity concentration on the rear surface side is lower than an impurity concentration on the front surface side.

12. The method of manufacturing a back-illuminated solid-state image sensing element according to claim 11, wherein each of the photodiodes are formed with a plurality of layers with impurity concentrations sequentially increasing from the rear surface side to the front surface side.

13. The method of manufacturing a back-illuminated solid-state image sensing element according to claim 12, wherein the plurality of layers is composed of at least three layers, and a layer having the larger area is only a layer closest to the rear surface side.

14. The method of manufacturing a back-illuminated solid-state image sensing element according to claim 12, wherein the plurality of layers is composed of at least three layers, and layers having the larger areas are layers other than a layer closest to the front surface side.

15. The method of manufacturing a back-illuminated solid-state image sensing element according to any one of claims 12 to 14, wherein the thickness of a layer closest to the front surface side among the plurality of layers is formed to be at least 1 μm or more.

16. The method of manufacturing a back-illuminated solid-state image sensing element according to any one of claims 12 to 14, wherein in the photodiodes, a layer closest to the front surface side is formed at an ion implantation concentration of $1e12/cm^2$ or more per unit area.

17. The method of manufacturing a back-illuminated solid-state image sensing element according to any one of claims 12 to 14, wherein in the photodiodes, layers other than a layer closest to the front surface side are formed at ion implantation concentrations less than $1e12/cm^2$ per unit area.

* * * * *